United States Patent
Martinez et al.

(10) Patent No.: US 8,558,200 B2
(45) Date of Patent: Oct. 15, 2013

(54) MULTIPLE ROW SCALABLE LED-UV MODULE

(75) Inventors: Aaron D. Martinez, Arvada, CO (US); Stephen J. Metcalf, Hudson, WI (US)

(73) Assignee: Air Motion Systems, Inc, River Falls, WI (US)

( * ) Notice: Subject to any disclaimer, the term of this patent is extended or adjusted under 35 U.S.C. 154(b) by 345 days.

(21) Appl. No.: 12/868,846

(22) Filed: Aug. 26, 2010

(65) Prior Publication Data

US 2011/0049392 A1    Mar. 3, 2011

Related U.S. Application Data

(60) Provisional application No. 61/237,455, filed on Aug. 27, 2009, provisional application No. 61/267,021, filed on Dec. 5, 2009, provisional application No. 61/237,436, filed on Aug. 27, 2009.

(51) Int. Cl.
*G21K 5/00* (2006.01)

(52) U.S. Cl.
USPC .................. 250/494.1; 250/492.1; 250/505.1; 250/493.1; 250/504 R; 313/1; 313/52; 362/227; 362/235; 438/28

(58) Field of Classification Search
USPC ...................... 347/102; 313/46; 362/218, 294; 250/493.1, 494.1, 503.1, 504 R, 492.1
See application file for complete search history.

(56) References Cited

U.S. PATENT DOCUMENTS

| | | | |
|---|---|---|---|
| 2005/0104946 A1* | 5/2005 | Siegel | 347/102 |
| 2005/0201098 A1* | 9/2005 | DiPenti et al. | 362/294 |
| 2006/0007290 A1* | 1/2006 | Oshima et al. | 347/102 |
| 2006/0192829 A1 | 8/2006 | Mills et al. | |
| 2008/0143806 A1* | 6/2008 | Claeys | 347/102 |
| 2009/0045714 A1 | 2/2009 | Claeys | |
| 2010/0008085 A1* | 1/2010 | Ivey et al. | 362/218 |
| 2010/0053956 A1* | 3/2010 | Park et al. | 362/235 |
| 2010/0171404 A1* | 7/2010 | Liu et al. | 313/46 |

FOREIGN PATENT DOCUMENTS

WO     WO 0163666 A1 * 8/2001

OTHER PUBLICATIONS

May 20, 2011 International Search Report for PCT/2010/US2010/046846.
May 20, 2011 Written Opinion of the International Searching Authority for PCT/US2010/046846.

* cited by examiner

*Primary Examiner* — Michael Logie
(74) *Attorney, Agent, or Firm* — Wm. Larry Alexander

(57) ABSTRACT

An LED-UV lamp that is easily interchangeable within a UV-curing process and scalable in length with a fine resolution so that it is easily customizable to any UV-curing application. The LED-UV lamp may incorporate multiple rows of LEDs and contain corresponding optics that effectively deliver radiant power to a substrate at distances of several inches.

12 Claims, 9 Drawing Sheets

SECTION A-A

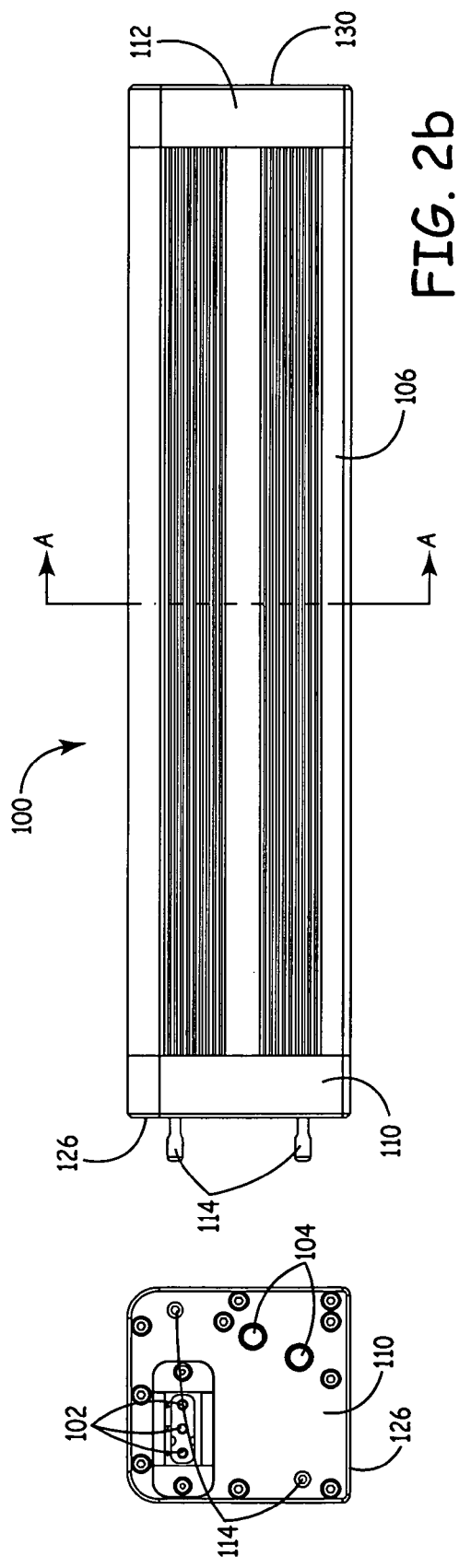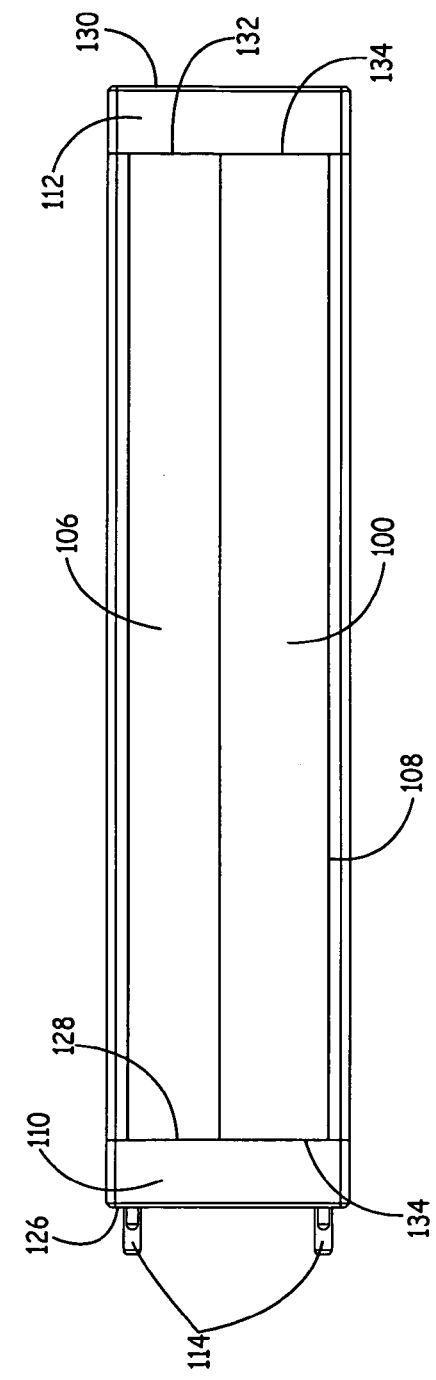

SECTION A-A

SECTION A-A

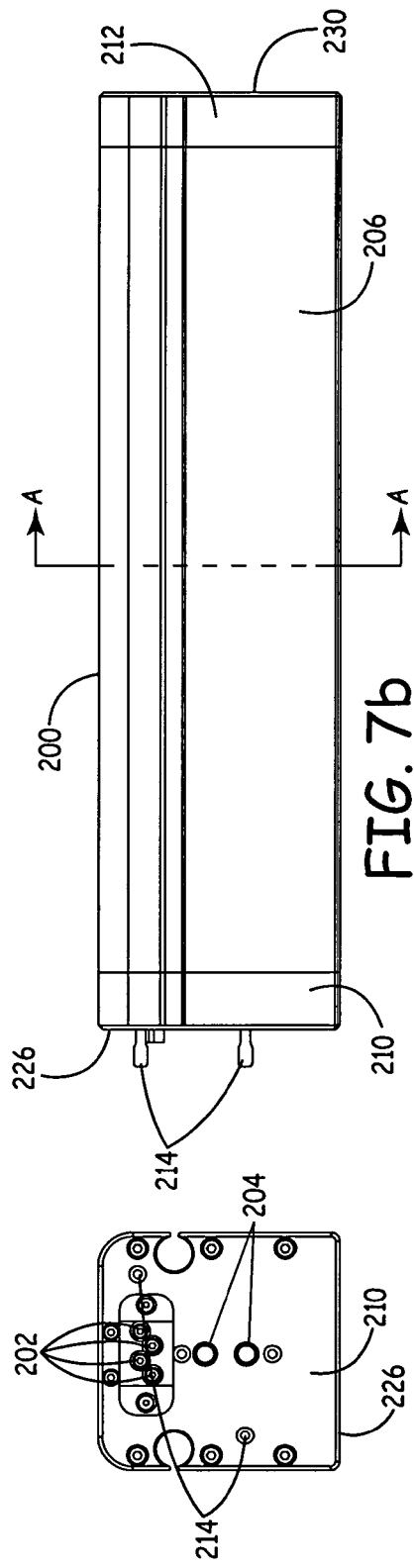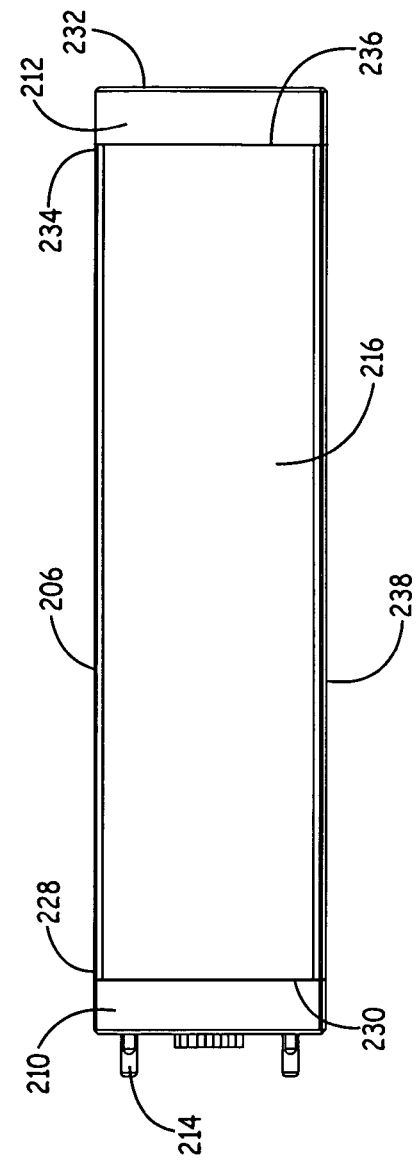

SECTION A-A

SECTION A-A

MULTIPLE ROW SCALABLE LED-UV MODULE

CROSS-REFERENCES TO RELATED APPLICATIONS

This application claims priority under 35 U.S.C. §119 (e) to, and hereby incorporates by reference, U.S. Provisional Application No. 61/237,455, filed 27 Aug. 2009, U.S. Provisional Application No. 61/267,021, filed 5 Dec. 2009, and U.S. Provisional Application No. 61,237,436, filed 27 Aug. 2009.

BACKGROUND OF THE INVENTION

1. Field of the Invention

The present invention relates to LED-UV lamps. More particularly, the invention is suitably used in the application of UV-curing of inks, coatings, and adhesives having UV photo initiators therein.

2. Background

UV LED lamps are permanently mounted within the UV-curing process. Depending upon the optics used, the UV LED lamps can be required to be located at a specific distance from the substrate so that uniformity and intensity are optimized. Some UV LED lamps are scalable in length with coarse resolution.

UV LED lamps are mounted into a UV-curing process in a manner that makes them difficult and time consuming to remove for cleaning, maintenance, or the like. UV LED lamps are mounted in fixed positions within the UV-curing process where the location within the position is often determined by the process machinery into which the UV curing LED lamps are being integrated.

Different positions within the UV-curing process could require the UV LED lamps to be at different locations with respect to the substrate. A conflict could arise between the location required by the optics of the lamp and the location determined by the machinery of a UV-curing process which scenario could render the UV LED lamp unsuitable for placement in particular positions within a UV-curing process.

If a lamp is required at an alternate location, either an existing lamp must be uninstalled from an existing location and reinstalled at the desired location which option would only be suitable if the location required by the optics of the UV LED lamp is compatible with the location available in the desired position, or a new lamp must be purchased possibly with redesigned optics. UV LED lamps of different wavelength would also not be easily interchangeable.

The coarse resolution in length scalability could result in the scenario where the lamp length options that are available are either too short or too long for a particular application which may make the UV LED lamps difficult or impossible to install into some UV-curing applications. For example, if the length of a UV LED lamp was scalable in 3 inch increments, and a 40 inch lamp was required, the options would either be 39 inches (13×3 inches), or 42 inches (14×3 inches). The 39 inch lamp would be too short and could result in uncured product at the ends of the lamp. The 42 inch lamp could be too long to fit into the envelope that is available within the UV-curing process.

SUMMARY OF THE INVENTION

LEDs are mounted onto short subassembly segments that may be produced in assorted lengths which segments are then easily mounted into the LED-UV module in a row running along the length of the module.

Assembling the LEDs in segments that are easily mounted into the LED-UV module would simplify the process of LED replacement and possibly make the process less expensive. If an LED fails, the segment whereon the failed LED had been assembled can be disconnected, removed, and then a new segment can be installed in its place.

The LEDs may degrade as they get older and their output power may decrease below an acceptable level for their application. In this case the owner of the LED-UV lamp would have the option of replacing the segments with new ones as opposed to replacing the whole module.

LEDs are solid state semiconductor devices. The efficiency and power output of LEDs can increase from one generation to the next as scientific breakthroughs are made and manufacturing processes improve. The owner of the LED-UV module would have the option to easily upgrade the module by swapping out old segments for new ones with improved operating characteristics.

Providing the segments in an assortment of lengths could enable the length of the row of segments to be scalable with a finer resolution than what may be possible if all of the segments where the same length, while at the same time the total number of parts required to assemble the row of LEDs could be reduced. For example, the segments could be configured in a 3 inch version, a 4 inch version, and a 6 inch version. A 12 inch row of segments could then be assembled by connecting 2 of the 6 inch segments. A 13 inch row of segments could be assembled by connecting a 6 inch segment, a 4 inch segment, and a 3 inch segment. A 14 inch row of segments could be assembled by connecting a 6 inch segment and two 4 inch segments. The row of LEDs could be assembled in a variety of lengths with a 1 inch resolution. On the other hand, if only one segment was made, in a 3 inch version for example, the resolution of the possible LED row lengths would be 3 inches, resulting in fewer length options available for customizability. The segment could be made in a 1 inch version to achieve a 1 inch resolution, but doing so could increase the complexity of the assembly by increasing the number of parts required to construct a row.

The main module body contains a surface extending the length of the module, whereon the LED segments can be mounted.

This surface provides correct positioning and easy mounting of the LED segments.

The main module body contains an integral heat sink feature with coolant passages that run the length of the module and are positioned such that they pass near the surface whereon the LED segments mount.

The heat sink feature provides a simple means of effectively extracting heat from the LEDs. This maintains the LED junction temperature at an acceptably low level thus maximizing the life of the LEDs.

The module is designed so that it is interchangeable and can therefore be quickly and easily installed into or removed from docking ports that are rigidly mounted into a UV-curing process without the use of tools.

Interchangeability allows the modules to be easily removed from the UV-curing process for cleaning, repair, maintenance, or the like. LED-UV modules of different wavelengths can be installed into the UV-curing process and the modules can be moved between different locations within the UV-curing process as long as there is a docking port available. Removal and installation of the LED-UV modules from the associated docking ports within a UV-curing process is a tool-less procedure and can be done by a person of no extraordinary skill.

All necessary connections (e.g. power, communication, liquid cooling) are made automatically upon installation of the LED-UV module into a docking port, and then disconnected automatically during the removal of the LED-UV module from a docking port.

Automatic engaging and disengaging of the connections between the LED-UV module and the docking port upon insertion and removal of the LED-UV module ensure that the connections are made properly, save time, and make the overall operation of the UV-curing process more convenient for the user.

All connection devices (e.g. electrical pins, coolant valves) are positioned such that they do not protrude beyond the outer surfaces of the LED-UV module.

Designing the connections such that they do not protrude beyond the outer surfaces of the module protects them from damage. With the LED-UV module being designed in a manner that the module is easily removable from the UV-curing process, the possibility of damage to the connections that could result from handling the module will be significantly reduced.

The LED-UV module can incorporate a common optical design using a parabolic or elliptical trough reflector that allows for varying distances and mounting locations with respect to the substrate being cured without a significant loss of uniformity or optical (irradiant) intensity.

LEDs, by themselves, typically exhibit a Lambertian radiation pattern in which the intensity of the light output by the LED chip is directly proportional to the cosine of the angle between the point of observation and the surface normal of the LED chip. An elliptical or parabolic trough reflector can effectively gather the light and project it onto a substrate that is positioned at varying distances (i.e. from fractions of an inch to several inches) from the base of the LED-UV module with a minimal loss in intensity and in a very uniform manner.

Without the use of a reflector, the LED-UV module may need to be placed at either a fixed, optics-dependent distance from the substrate or much closer to the substrate than would be allowable by some UV-curing processes or some positions within a UV-curing process. One example could be in a sheet-fed printing press. In sheet-fed printing, it is typically desirable to locate one or more LED-UV modules immediately following the application of one or more UV-curable inks following the inking units of the printing machine in order to "pin" or "dry" the UV-curable inks or spot varnishes prior to the application of a UV-curable coating at the end of the press prior to the delivery of sheets onto a pile. For inking unit curing locations (immediately following the inking units), it would be desirable to locate the LED-UV modules closer (typically 1 to 3 inches) to the substrate for the benefit of easier mechanical mounting in order to fit within the space constraints provided by various makes and models of printing machines. However, at end-of-press curing locations, the method of sheet transfer provided by most printing machines prohibits closer mechanical location through the end-of-press sheet delivery area and would require the LED-UV module to be mounted as far as 3 to 5 inches away from the substrate. If the LED-UV module were placed too close to the substrate it would collide with the moving machinery of the printing press. The use of reflector style optics enables a single, interchangeable design of the LED-UV module of the invention to be placed in multiple docking or mounting positions at differing distances to the substrate without significant loss of optical uniformity or radiant intensity within a UV-curing process that would otherwise have inaccessible or impractical mounting locations and/or require multiple, non-interchangeable optical designs of the LED-UV modules between the various positions of the process.

The LED-UV modules would be available in a variety of UV wavelengths and each wavelength module would be interchangeable with the others and could therefore be applied to any docking port within the UV-curing process.

Different types of UV curable products can cure most effectively when irradiated by different wavelengths of UV light. For example, clear products may cure most effectively with longer wavelength UV light, while darker, more heavily pigmented products may cure more effectively with shorter wavelength UV light. Overall system performance may be maximized by the ability to interchange LED-UV modules of different wavelength within the UV-curing process depending upon the preferences of the UV-curable product that is being cured.

The LED-UV module could incorporate multiple, adjacent, parallel rows of LEDs where each row shines into a corresponding trough reflector.

Incorporating multiple, adjacent, parallel rows of LEDs where each row shines into a corresponding trough reflector would increase the radiant power output by the LED-UV module by a factor equal to the number of rows of LEDs. A single lamp of this embodiment could have the same radiant power output as multiple lamps of the single row embodiment with the added advantages of lower cost and smaller form factor compared to multiple lamps of the single row embodiment.

BRIEF DESCRIPTION OF THE DRAWINGS

FIG. 2a is a top view of the embodiment of FIG. 1.

FIG. 2b is a side view of the embodiment of FIG. 1.

FIG. 2c is an end view of the embodiment of FIG. 1.

FIG. 7a is a top view of the LED-UV module shown in FIG. 6.

FIG. 7b is a side view of the LED-UV of FIG. 6.

FIG. 7c is an end view of the LED-UV module shown in FIG. 6.

Figure 1:
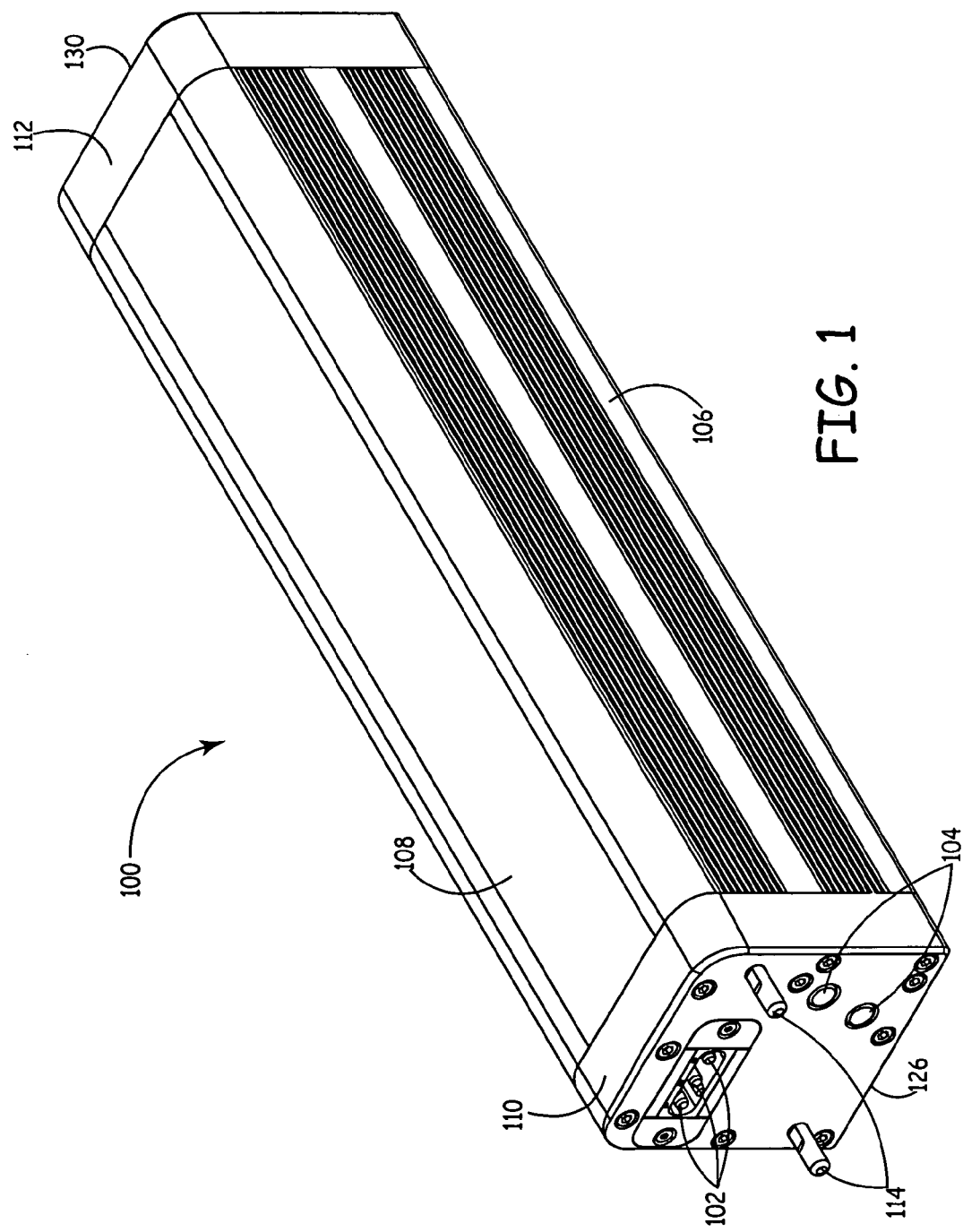
FIG. 1 is an isometric view of one embodiment of the LED-UV module of the invention.
Figure 3:
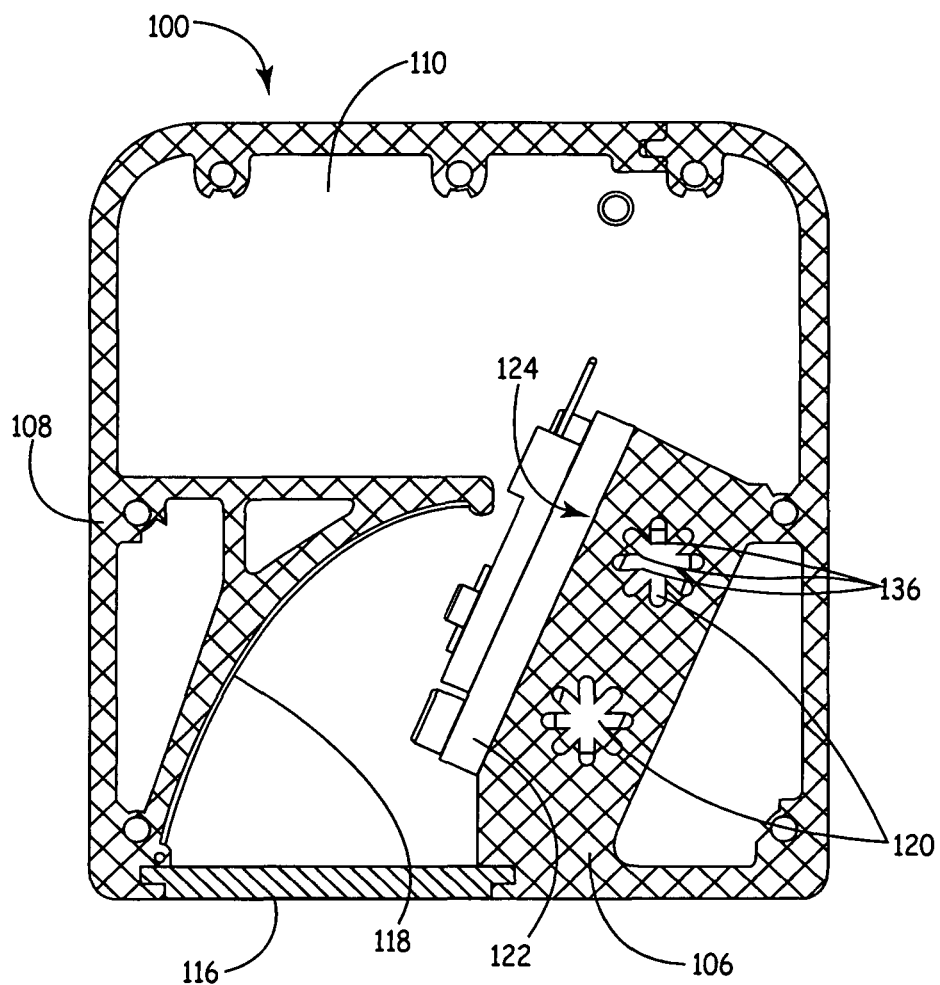
FIG. 3 is a cross section view of the embodiment of the LED-UV module shown in FIGS. 1 and 2 along line A-A of FIG. 2b.

It is understood that the above-described figures are only illustrative of the present invention and are not contemplated to limit the scope thereof.

DETAILED DESCRIPTION OF THE INVENTION

The following is a description of possible embodiments of the LED-UV module of the invention. The examples and figures that follow are intended to teach a person skilled in the art how to effectively design and implement the present invention, but are not intended to limit the scope of the invention. The features and methods disclosed in the detailed description may be used separately or in conjunction with other features and methods to provide improved devices of the invention and methods for making the same. The features and methods disclosed in this detailed description may not be necessary to practice the invention in the broadest sense, but are provided so that a person of skill in the art may further understand the details of the invention.

Another description of the LED-UV lamp of this invention, as well as a docking system accommodating such lamp, is present in U.S. patent application Ser. No. 12/868,827, entitled Interchangeable UV LED Curing System, and filed concurrently with this application, the entire disclosure of such application hereby incorporated by reference.

Referring to FIGS. 1, 2a-c, and 3, an LED-UV module 100 is shown having electrical connections 102, coolant valves 104, a module body 106, a module cover 108, a connection end cap 110, a cross-over end cap 112, alignment pins 114, a transparent cover 116, a trough reflector 118, coolant passages 120, LED segments 122, and a surface 124 on the module body 106 to mount the LED segments 122.

The electrical connections 102 would be located on the connection end 126 of the LED-UV module 100 and may be mounted onto the connection end cap 110. To protect the electrical pins 102 from damage during handling of the LED-UV module 100, the electrical connections 102 could be mounted to the connection end cap 110 in a recessed fashion so that they do not protrude beyond the outer surfaces of the connection end cap 110. The electrical connections 102 would be used to transfer power and possibly communications from the LED-UV module 100 to mating electrical connections that would be present in the docking ports within the UV-curing process. The electrical connections could be pin and socket type connections.

The coolant valves 104 would be located on the connection end 126 of the LED-UV module 100 and may be mounted onto the connection end cap 110. To protect the coolant valves 104 from damage during handling of the LED-UV module 100, the coolant valves 104 could be located on the connection end cap 110 such that they do not protrude beyond the outer surfaces of the connection end cap 110. The coolant valves 104 would connect to mating coolant valves that would be present in the docking port and would provide a supply and return for cooling fluid to flow through the LED-UV module 100. The coolant valves 104 and the mating coolant valves in the docking port could be spring actuated poppet style valves that would automatically be pushed open when they are engaged, and automatically spring closed when they are disengaged.

The module body 106 would be the main supporting component of the LED-UV module 100. Two significant features on the module body 106 could be the surface 124 that locates the LED segments 122, and the coolant passages 120. The module body 106 could support one edge of the transparent cover 116. The module body 106 could be made of an extrusion out of a material that is a good heat conductor such as aluminum.

The module cover 108 would serve as the final component of the LED-UV module 100 assembly and cover all of the internal components. The module cover 108 could contain a feature that would hold the trough reflector 118 in the correct position and shape. The module cover 108 could support one edge of the transparent cover 116. The module cover 108 could be made of an extrusion and the material could suitably be the same as the material of the module body 106.

The connection end cap 110 would serve as the mounting structure for the electrical connections 102, coolant water valves 104, and the alignment pins 114. The connection end cap 110 would mount to the appropriate end of the module body 106 forming the connection end 126 of the LED-UV module 100. Power and communications would pass through the connection block 110 into the inside of the LED-UV module 100 through the electrical connections 102. Liquid coolant would flow between the coolant valves 104 and the coolant passages 120 at the interface 128 where the connection block 110 mounts to the module body 106. This interface may be sealed by a gasket such as an o-ring to prevent liquid coolant from leaking at the interface 128.

The cross-over end cap 112 would mount to the end of the module body 106 that is opposite the connection block 110 forming the cross-over end 130 of the LED-UV module 100. The cross-over end cap would contain a passage that would connect one of the coolant passages 120 to the other thus forming a circuit for liquid coolant to flow into the LED-UV module 100 through one of the coolant valves 104, through one of the water passages 120, through the passage in the cross-over end cap 112 through the other of the water passages 120, and then out of the LED-UV module 100 through the other of the coolant valves 104. The interface 132 between the cross-over end cap 112 and the module body 106 could be sealed with a gasket such as an o-ring to prevent liquid coolant from leaking at the interface 132.

The alignment pins 114 would be located on the connection end of the LED-UV module and may be mounted to the connection block 110. The alignment pins 114 could serve to align the connections 102, 104 prior to their engagement with the mating connections present in the docking port.

The transparent cover 116 would most suitably be made of a durable material that would be highly UV transparent such as quartz, glass, acrylic, or the like. The transparent cover 116 would serve as a protective window that would protect the internal components of the LED-UV module while allowing the light generated by the LEDs to pass through the transparent cover. The transparent cover could be supported on one edge by the module body 106 and supported on the opposite edge by the module cover 108. The ends 134 of the transparent cover 116 could be trapped by the connection end cap 110 on one end and the cross-over end cap 112 on the other.

The reflector 118 would be made of a highly UV reflective material such as acrylic mirror, polished metal, or the like, and could be formed into shape prior to installation into the LED-UV module 100. The reflector 118 could be held in position and shape by a mating feature in the module cover 108. The reflector could be trough shaped and may incorporate a parabolic or elliptical geometry that would transfer the UV light emitted by the LEDs onto the substrate.

The coolant passages 120 would run the length of the module body 106 and be positioned so that they pass near the surface 124 whereon the LED segments 122 mount. The coolant passages 120 facilitate the removal of heat generated by the LEDs and may be dimensioned and located such that the temperature of the module body 106 is essentially uniform over a length of such module. Heat generated at the P/N junctions of the LEDs is conducted from the LED segments 122, into the module body 106 where it is transferred to the liquid coolant by means of convection at the surfaces of the coolant passages 120. The coolant passages could contain fin features 136 that protrude into the liquid coolant. The fin features 136 would serve to increase the convective surface area of the coolant passages 120 as well as generate turbulence in the liquid coolant that would increase the associated convection coefficient. The fin features could also increase the rate of heat conduction through the module body. The presence of fin features 136 in the coolant passages 120 would serve to increase the rate of heat convection from the module body 106 to the liquid coolant, ultimately resulting in lower LED junction temperatures. Lower LED junction temperatures could enable longer LED lifetimes.

Figure 4:
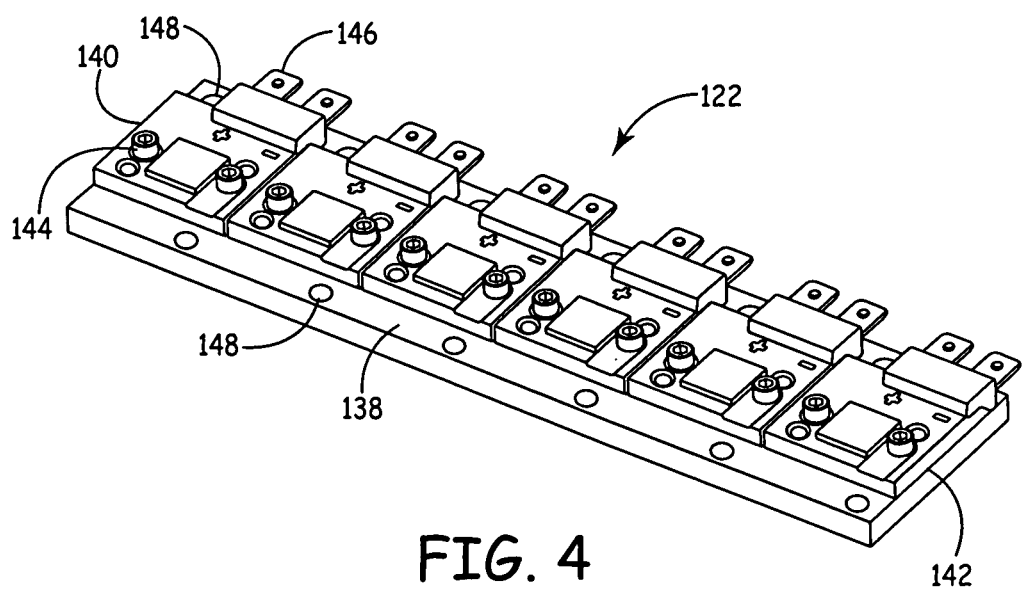
FIG. 4 is a perspective view of one embodiment of an LED segment assembly of the invention.

One embodiment of an LED segment 122 is shown in FIG. 4. The LED segment 122 could consist of a heat transfer plate 138, a plurality of LED packages or segments 140, thermal interface material 142, and fasteners 144 to attach the LED packages 140 to the heat transfer plate 138. The LED packages 140 could be off-the-shelf packages or they could be custom designed. The LED package 140 specifications could suitably be low thermal resistance, high powered UV output, and quick disconnect power terminals 146. The LED segment 122 could contain mounting features such as bolt holes 148 to enable fastening to the module body 106 in a manner that maximizes heat transfer from the LED segment 122 to the module body 106. Multiple LED segments 122 could suitably be mounted to the module body in a lengthwise, end-to-end configuration to form a long row of LEDs. The LED segments 140 would be designed in a manner that maximizes the LED line density (i.e. number of LEDs per inch) and the LED segments 140 could be designed in an assortment of lengths which would enable finer length resolution when assembling the LED segments 140 in a lengthwise, end-to-end configuration to form a long row of LEDs. The finer length resolution would facilitate customizability for a variety of different length UV-curing applications. Providing the segments 140 in an assortment of lengths could enable the length of the row of segments 140 to be scalable with a finer resolution than what may be possible if all of the segments 140 were the same length, while at the same time the total number of parts required to assemble the row of LEDs could be reduced. For example, the segments 140 could be configured in a 3 inch version, a 4 inch version, and a 6 inch version. A 12 inch row of segments 140 could then be assembled by connecting 2 of the 6 inch segments. A 13 inch row of segments 140 could be assembled by connecting a 6 inch segment, a 4 inch segment, and a 3 inch segment. A 14 inch row of segments 140 could be assembled by connecting a 6 inch segment and two 4 inch segments. The row of LED segments 140 could be assembled in a variety of lengths with a 1 inch resolution. On the other hand, if only one segment 140 was made, in a 3 inch version for example, the resolution of the possible LED row lengths would be 3 inches, resulting in fewer length options available for customizability. The segment 140 could be made in a 1 inch version to achieve a 1 inch resolution, but doing so could increase the complexity of the assembly by increasing the number of parts required to construct a row.

Figure 5:
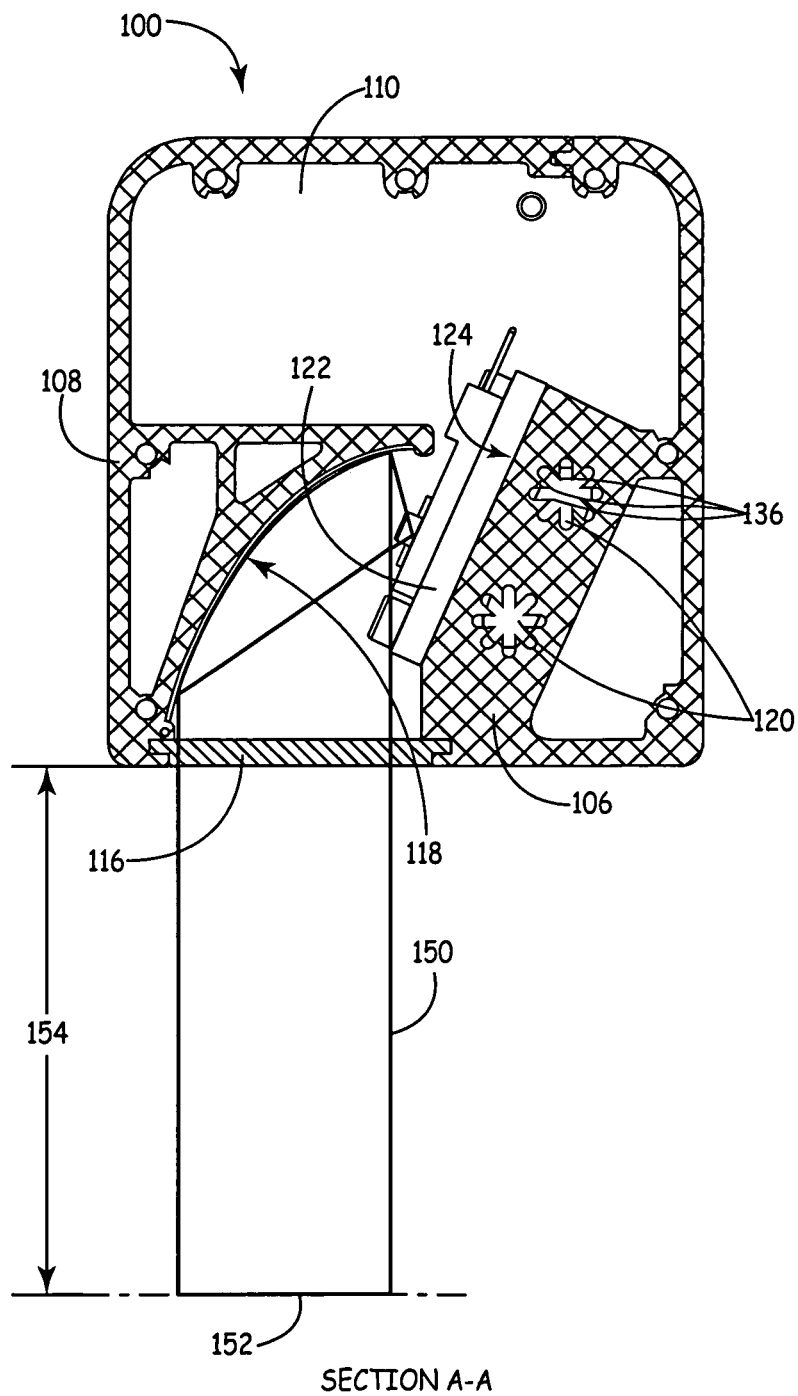
FIG. 5 is a cross sectional view of one embodiment of the application of a trough reflector to aid in the transference of UV light from the LEDs onto the substrate.
Figure 6:
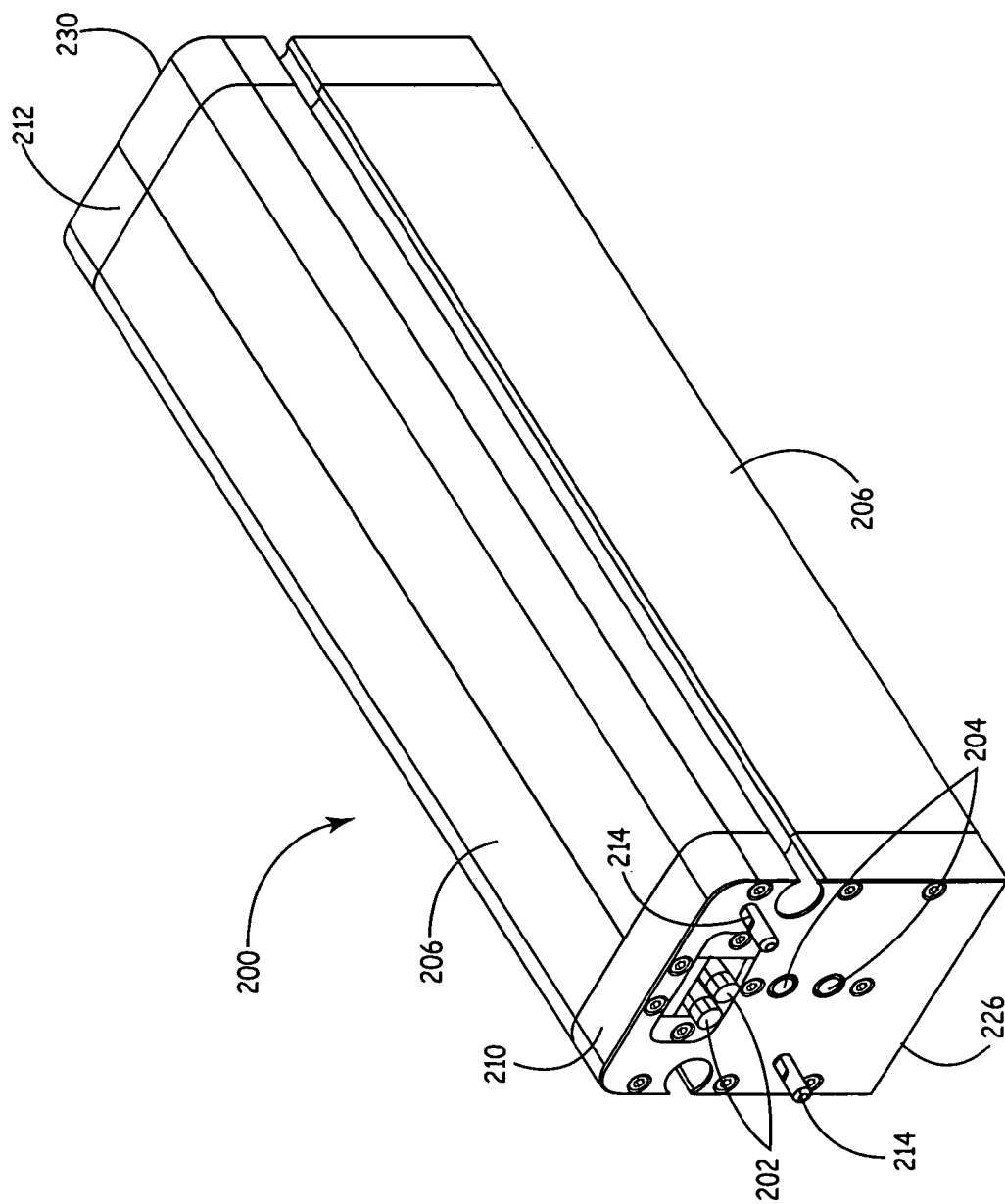
FIG. 6 is an isometric view of another embodiment of the LED-UV module of the invention incorporating a plurality of adjacent, parallel rows of LEDs and multiple trough reflectors.
Figure 8:
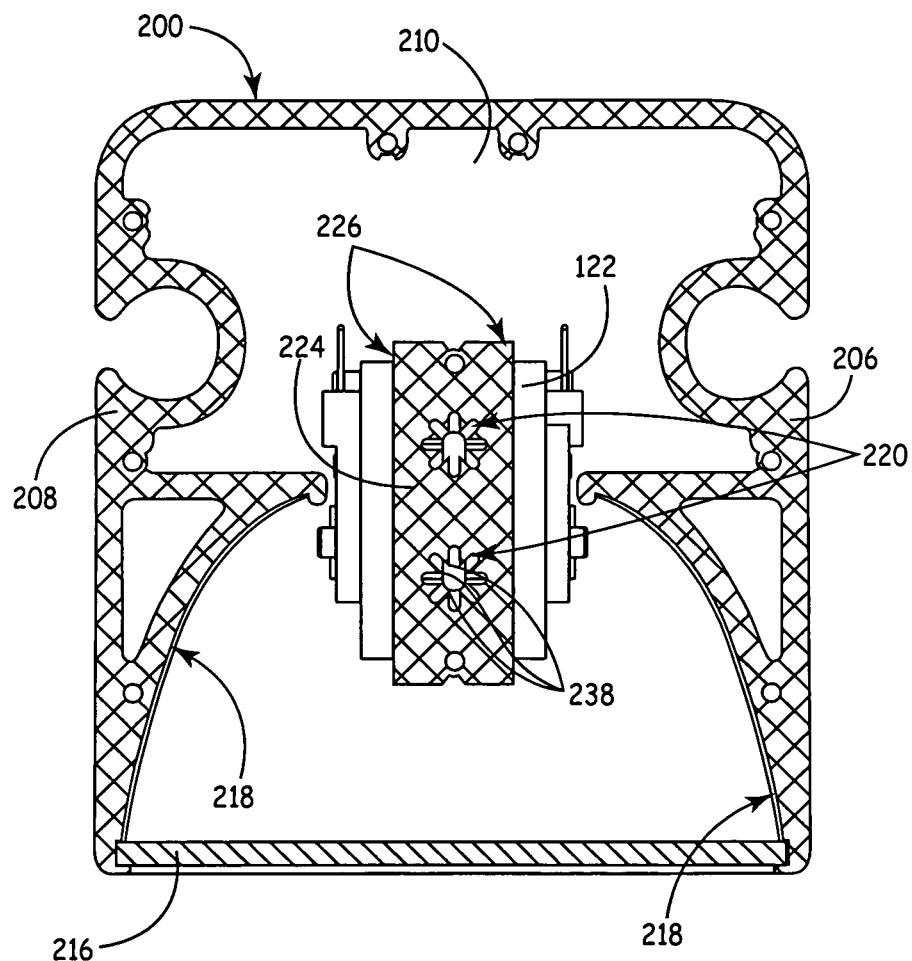
FIG. 8 is a cross section view of the embodiment of the LED-UV module shown in FIGS. 6 and 7a-c along line A-A of FIG. 7b.

FIG. 5 illustrates how the implementation of a trough reflector 118 could effectively transfer light 150 from the LEDs onto a substrate 152 at a distance 154 of several inches. This type of optical configuration would be very suitable for UV-curing applications wherein it is not possible to place the LED-UV module in close proximity to the substrate.

Some UV-curing applications may require more UV power than an LED-UV module 100 having a single row of LED segments 122 can provide. An alternative embodiment of the LED-UV module 100 of the invention could consist of two or more adjacent, parallel rows of LED segments 122 shining into separate trough reflectors 118.

Referring to FIGS. 6, 7a-c, and 8, an LED-UV module 200 is shown having electrical connections 202, coolant valves 204, a first module cover 206, a second module cover 208, a connection end cap 210, a cross-over end cap 212, alignment pins 214, a transparent cover 216, a plurality of trough reflectors 218, coolant passages 220, LED segments 122, a heat sink 224, and surfaces 226 on the heat sink 224 to mount the LED segments 122.

The electrical connections 202 would be located on the connection end 228 of the LED-UV module 200 and may be mounted onto the connection end cap 210. The electrical connections 202 would be used to transfer power and possibly communications from the LED-UV module 200 to mating electrical connections that would be present in the docking ports within the UV-curing process. The electrical connections could be pin and socket type connections.

The coolant valves 204 would be located on the connection end 228 of the LED-UV module 200 and may be mounted onto the connection end cap 210. To protect the coolant valves 204 from damage during handling of the LED-UV module 200, the coolant valves 204 could be located on the connection end cap 210 such that they do not protrude beyond the outer surfaces of the connection end cap 210. The coolant valves 204 would connect to mating coolant valves that would be present in the docking port and would provide a supply and return for cooling fluid to flow through the LED-UV module 200. The coolant valves 204 and the mating coolant valves in the docking port could be spring actuated poppet style valves that would automatically be pushed open when they are engaged, and automatically spring closed when they are disengaged.

The first module cover 206 would cover one side of the LED-UV module 200. The first module cover 206 could contain a feature that would hold one of the trough reflectors 218 in the correct position and shape and the first module cover 206 could support one edge of the transparent cover 216. The first module cover 206 could be made of an extrusion out of a material such as aluminum or plastic.

The second module cover 208 would cover the other side of the LED-UV module 200. The second module cover 208 could contain a feature that would hold another of the trough reflectors 218 in the correct position and shape and the second module cover 208 could support the other edge of the transparent cover 216. The second module cover 208 could be made of an extrusion out of a material such as aluminum or plastic.

The connection end cap 210 would serve as the mounting structure for the electrical connections 202, coolant water valves 204, and the alignment pins 214. The connection end cap 210 would mount to the appropriate end of the LED-UV module 200 forming the connection end 228 of the LED-UV module 200. Power and communications would pass through the connection block 210 into the inside of the LED-UV module 200 through the electrical connections 202. Liquid coolant would flow between the coolant valves 204 and the coolant passages 220 at the interface 230 where the connection block 210 mounts to the heat sink 224. This interface may be sealed by a gasket such as an o-ring to prevent liquid coolant from leaking at the interface 230.

The cross-over end cap 212 would mount to the end of the LED-UV module 200 that is opposite the connection block 210 forming the cross-over end 232 of the LED-UV module 200. The cross-over end cap 212 would contain a passage that would connect one of the coolant passages 220 to the other thus forming a circuit for liquid coolant to flow into the LED-UV module 200 through one of the coolant valves 204, through one of the water passages 220, through the passage in the cross-over end cap 212 through the other of the water passages 220, and then out of the LED-UV module 200 through the other of the coolant valves 204. The interface 234 between the cross-over end cap 212 and the module body 206 could be sealed with a gasket such as an o-ring to prevent liquid coolant from leaking at the interface 234.

The alignment pins 214 would be located on the connection end of the LED-UV module and may be mounted to the connection block 210. The alignment pins 214 could serve to align the connections 202, 204 prior to their engagement with the mating connections present in the docking port.

The transparent cover 216 would most suitably be made of a durable material that would be highly UV transparent. The transparent cover 216 would serve as a protective window that would protect the internal components of the LED-UV module while allowing the light generated by the LEDs to pass through the transparent cover 216. The transparent cover 216 could be supported on one edge by the first module cover 206 and supported on the opposite edge by the second module cover 208. The ends 234 of the transparent cover 216 could be trapped by the connection end cap 210 on one end and the cross-over end cap 212 on the other.

The reflectors 218 would be made of a highly UV reflective material and could be formed into shape prior to installation into the LED-UV module 200. The reflectors 218 could be held in position and shape by mating features in the first and second module covers 206 and 208. The reflectors 218 could be trough shaped and may incorporate a parabolic or elliptical geometry that would transfer the UV light emitted by the LEDs onto the substrate.

The coolant passages 220 would run the length of the heat sink 224 and be positioned so that they pass near the surface 226 whereon the LED segments 122 mount. The coolant passages 220 facilitate the removal of heat generated by the LEDs. Heat generated at the P/N junctions of the LEDs is conducted from the LED segments 122, into the heat sink 224 where it is transferred to the liquid coolant by means of convection at the surfaces of the coolant passages 220. The coolant passages could contain fin features 238 that protrude into the liquid coolant. The fin features 238 would serve to increase the convective surface area of the coolant passages 220 as well as generate turbulence in the liquid coolant that would increase the associated convection coefficient. The fin features 238 could also increase the rate of heat conduction through the module body. The presence of fin features 238 in the coolant passages 220 would serve to increase the rate of heat convection from the heat sink 224 to the liquid coolant, ultimately resulting in lower LED junction temperatures. Lower LED junction temperatures could enable longer LED lifetimes.

Figure 9:
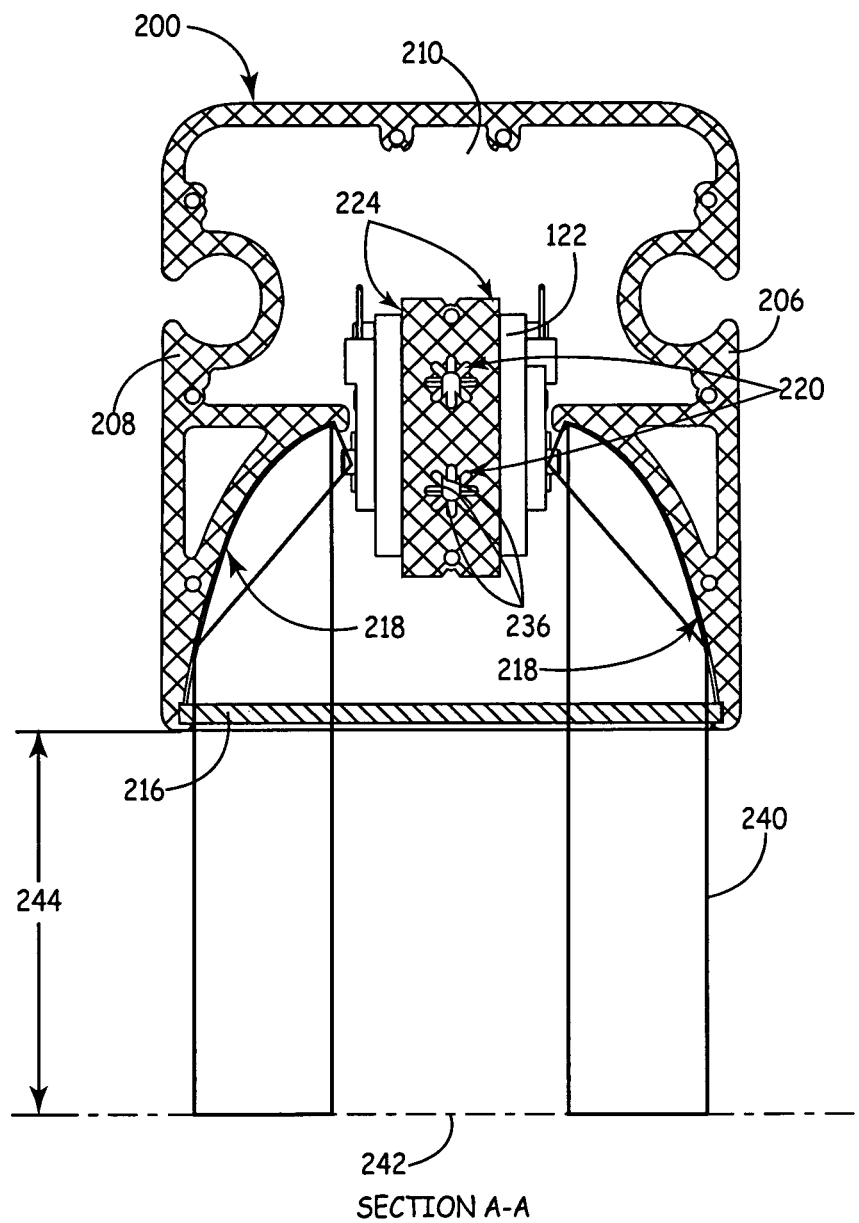
FIG. 9 is an illustration of one embodiment of the application of a plurality of trough reflectors to aid in the transference of UV light from the LEDs onto the substrate and to multiply the available radiant power.

FIG. 9 illustrates how the implementation of a plurality of trough reflectors 218 could effectively transfer light 240 from the multiple, adjacent, parallel rows of LEDs onto a substrate 242 at a distance 244 of several inches. This type of optical configuration would be very suitable for UV-curing applications wherein it is not possible to place the LED-UV module in close proximity to the substrate and where the power of multiple LED-UV lamps 100 is required in a single location.

The LED-UV modules 100, 200 of the invention could be produced in an assortment of models where each model would have a different peak wavelength, or could have a plurality of peak wavelengths, in its spectral output depending on the LEDs used in the LED segments 122. To achieve a plurality of peaks in the spectral output of the LED-UV modules 100,200, a mixture of LEDs of different UV wavelength could be used, in an alternating pattern, within each LED segment 122. A single LED-UV module 100,200 with a single peak wavelength in its spectral output is contemplated to be within the spirit and scope of this invention. Additionally, a single LED-UV module 100,200 with a plurality of peak wavelengths in its spectral output is contemplated to be within the spirit and scope of this invention.

Having different models of LED-UV modules 100,200 available, each with a different peak wavelength output, or emitting a plurality of peak wavelengths, and where the LED-UV modules 100,200 are interchangeable within a UV-curing process would increase the flexibility of the UV-curing system. Many LED-UV lamps are available in an assortment of UV wavelengths and some with the option of multiple peaks in their spectral output. The LED-UV modules 100,200 of this invention would be designed such that they can be quickly inserted into and removed from a UV-curing process without the use of tools provided that the associated docking ports are mounted into the UV-curing process. A model of an LED-UV module 100,200 of one UV spectral output can be removed and a model of a different UV spectral output can be inserted in a matter of minutes by a person of no extraordinary skill.

A person of ordinary skill in the art will readily appreciate that individual components shown on various embodiments of the present invention are interchangeable to some extent and may be added or interchanged on other embodiments without departing from the spirit and scope of this invention.

Because numerous modifications of this invention may be made without departing from the spirit thereof, the scope of the invention is not to be limited to the embodiments illustrated and described. Rather, the scope of the invention is to be determined by the appended claims and their equivalents.

What is claimed is:

1. A UV LED lamp, comprising: a pair of end caps; a heat sink mounted between said end caps; a LED segment with a first plurality of LED subassembly packages, said LED segment having a heat transfer plate, a thermal interface material contacting said heat transfer plate, said LED subassembly packages contacting said thermal interface material, said heat transfer plate contacting a first surface of said heat sink; and
    a first reflector positioned to reflect and focus radiation from the LED subassembly packages onto a substrate, wherein said first plurality of LED subassembly packages is varied in number to accommodate a variable width or length of said substrate.

2. The UV LED lamp of claim 1, further comprising another LED segment and a second reflector, said other LED segment with a second plurality of LED subassembly packages mounted to a second surface of said heat sink,
    wherein said second plurality of LED packages is varied in number to accommodate said variable width or length of said substrate, said second reflector positioned to reflect and focus radiation from the second plurality of LED subassembly packages onto said substrate.

3. The UV LED lamp of claim 2, wherein said second plurality of LED subassembly segments emits a radiation wavelength differing from a radiation wavelength of said first plurality of LED subassembly segments.

4. A method of curing materials deposited on a substrate, said materials having UV photoinitiators, such method comprising directing UV radiation at said substrate, said UV radiation originating from the UV LED lamp of claim 2.

5. The method of claim 4, wherein a different material is cured by each of said subassemblies, such subassemblies emitting differing wavelengths of UV radiation.

6. The method of claim 4, further comprising cooling said UV subassembly segments.

7. The method of claim 6, wherein said UV subassembly segments are cooled by circulating coolant through a pair of coolant passages located in said heat sink.

8. The UV LED lamp of claim 1, further comprising a plurality of alignment pins extending from one of said end caps.

9. The UV LED lamp of claim 1, further comprising a pair of fluid valves for admitting coolant to ingress and egress said heat sink.

10. The UV LED of claim 9, wherein said heat sink defines a pair of coolant passages, wherein one of said coolant passages admits coolant ingressing said heat sink and wherein the other of said coolant passages admits coolant egressing said heat sink.

11. The UV LED of claim 10, wherein each of said coolant passages is bounded by fin features protruding into said liquid coolant.

12. A method of curing materials deposited on a substrate, said materials having UV photoinitiators, such method comprising directing UV radiation at said substrate, said UV radiation originating from the UV LED lamp of claim 1.

\* \* \* \* \*